United States Patent [19]

Kobashi et al.

[11] Patent Number: 4,940,015
[45] Date of Patent: Jul. 10, 1990

[54] PLASMA REACTOR FOR DIAMOND SYNTHESIS

[75] Inventors: Koji Kobashi, Nishinomiya; Kozo Nishimura, Kobe; Koichi Miyata, Akashi; Yoshio Kawate, Kobe; Kazuo Kumagai, Kobe; Norio Suzuki, Kobe; Yutaka Kawata, Kobe; Kiyotaka Ishibashi, Kobe, all of Japan

[73] Assignee: Kabushiki Kaisha Kobe Seiko Sho, Kobe, Japan

[21] Appl. No.: 379,586

[22] Filed: Jul. 13, 1989

[30] Foreign Application Priority Data

Jul. 30, 1988 [JP] Japan ................... 63-190832
Nov. 15, 1988 [JP] Japan ................... 63-289641

[51] Int. Cl.$^5$ ............................................ C23E 16/50
[52] U.S. Cl. ........................... 118/723; 118/729; 156/DIG. 68; 315/111.21; 427/39; 427/45.1
[58] Field of Search ............... 118/723, 729; 156/610, 156/612, 613, 614, DIG. 68, 345; 219/10.55 A, 10.55 F; 315/111.21; 423/446; 427/39, 45.1

[56] References Cited

U.S. PATENT DOCUMENTS

4,339,326  7/1982  Hirose et al. ................ 156/345

FOREIGN PATENT DOCUMENTS

| | | |
|---|---|---|
| 63732 | 4/1984 | Japan . |
| 27753 | 7/1984 | Japan . |
| 27754 | 7/1984 | Japan . |
| 33300 | 2/1985 | Japan . |
| 54996 | 3/1985 | Japan . |
| 60-86096 | 5/1985 | Japan ............. 156/DIG. 68 |
| 200898 | 10/1985 | Japan . |
| 221396 | 11/1985 | Japan . |
| 6199 | 1/1986 | Japan . |
| 36200 | 2/1986 | Japan . |
| 77697 | 4/1986 | Japan . |
| 61-131450 | 6/1986 | Japan ............. 156/345 |
| 163195 | 7/1986 | Japan . |
| 198277 | 9/1987 | Japan . |
| 118074 | 5/1988 | Japan . |
| 176399 | 7/1988 | Japan . |
| 265892 | 11/1988 | Japan . |

*Primary Examiner*—Richard Bueker
*Assistant Examiner*—Terry J. Owens
*Attorney, Agent, or Firm*—Oblon, Spivak, McClelland, Maier & Neustadt

[57] ABSTRACT

A plasma reactor for diamond synthesis includes a microwave generator, a waveguide connected to the microwave generator, an antenna disposed within the waveguide to direct the microwaves propagated along the waveguide toward the interior of a reaction chamber, a microwave window provided above the upper wall of the waveguide, a reaction chamber defined by (a) a cylindrical bottom member hermetically joined to the microwave window and the waveguide, (b) a reaction gas inlet port and a gas outlet port in the side wall thereof, and (c) a substrate holder disposed within the reaction chamber in facing opposition to the microwave window so as to be moved toward and away from the microwave window to adjust the distance between the microwave window and the substrate holder to generate a desired microwave resonance mode. A plasma is produced only in the central portion of the reaction chamber, so that the etching of the microwave window and the resulting contamination of the diamond film by impurities produced by etching the microwave window are prevented. The plasma reactor for diamond synthesis is capable of forming a high-quality diamond film on a large surface of a substrate at a high growth rate in a range of 1 to 2 $\mu$m/hr.

9 Claims, 5 Drawing Sheets

← CH4 + H2

PLASMA REACTOR FOR DIAMOND SYNTHESIS

BACKGROUND OF THE INVENTION

1. Field of the Invention

The present invention relates to a plasma reactor for diamond synthesis.

2. Description of the Prior Art

Diamond film synthesized from gas phase has potential applications in various industrial fields and a strong demand for diamond films is expected in the future. However, extensive research and development activities have a history of only about five years and there are still many subjects of technical development to be completed for the industrial applications of diamond films.

The most important subject at the present stage is the development of deposition techniques of a diamond film on a large area of the substrate surface. For example, semiconductor industry, which is the most prospective field of diamond film application, requires techniques capable of depositing a diamond film on the surface of a several inch silicon wafer. Nevertheless, no technique meeting such a requirement has been proposed. Conventional diamond thin film forming techniques will be explained hereinafter.

(1) Conventional Technique I

The conventional technique I employs a hot filament for decomposing the reaction gas and heating the substrate. The principle of the conventional technique I is simple and is considered to have the highest possibility of industrial application.

FIG. 5 is a schematic view of an apparatus for the conventional technique I. It consists of a quartz tube 61, an electric furnace 62 enclosing the tube 61 to maintain the substrate temperature at an appropriate temperature (about 650° C.), a substrate holder 63 disposed within the tube to hold a substrate 64 thereon, and a tungsten filament 65 disposed within the tube 61 and above the substrate 64 placed on the substrate holder 63 at a small distance (about 1 cm) from the substrate 64. The filament is electrically heated at about 2000° C. to decompose the reaction gas and to heat the surface of the substrate 64 to a temperature in the range of 800° to 1000° C., which is the optimum temperature for diamond synthesis. The interior of the tube 61 is evacuated by a vacuum pump, not shown and then a reaction gas (usually $CH_4+H_2$) of an appropriate $CH_4$ concentration and a pressure of about 40 Torr is supplied into the tube 61 to make a diamond film grow spontaneously on the surface of the substrate 64.

(2) Conventional Technique II

The conventional technique II employs microwaves to produce a stable plasma.

FIG. 6 is a schematic view of an apparatus for the conventional technique II. The apparatus consists of microwaves generator 71 for a microwave of 2.45 GHz in frequency, a quartz tube 73, and a waveguide 72 for guiding the microwaves to the tube 73. A substrate 74 is disposed within the tube 73 at the intersection of the waveguide 72 and the tube 73. The tube 73 is evacuated by a vacuum pump, not shown, a reaction gas (usually $CH_4+H_2$) is supplied into the tube 73, and then microwaves are irradiated by the microwave generator 71 to produce a plasma which encloses the substrate 74. Consequently, a diamond film grows spontaneouslly on the surface of the substrate 74. Ordinarily, the temperature of the substrate 74 is in the range of 800° to 1000° C., and the pressure of the gas within the tube 73 is in the range of 30 to 50 Torr.

(3) Conventional Technique III

The conventional technique III also employs microwaves for producing a plasma. FIG. 7 shows a reactor utilizing electron cyclotron resonance for the conventional technique III. The reactor comprises a microwave cavity 82, a vacuum chamber 84 connected to the cavity 82 by means of an opening 85, a waveguide 81 for guiding the microwaves into the cavity 82, a quartz window 83 provided at the junction of the waveguide 81 and the cavity 82, and electromagnets 87 enclosing the cavity 82 and the vacuum chamber 84 to create a magnetic field of an intensity meeting conditions for the electron cyclotron resonance within the cavity 82. A substrate 86 is usually placed within the vacuum chamber 84. The vacuum chamber 84 is connected to a vacuum pump, not shown, to evacuate the cavity 82 and the vacuum chamber 84. The energy of the microwaves introduced into the microwave cavity 82 is efficiently consumed by the electron cyclotron resonance within the cavity 82 to produce a plasma of a reaction gas (usually $CH_4+H_2$) supplied into the cavity 82. The plasma flows out into the vacuum chamber 84, and thereby a diamond film is formed on the surface of the substrate 86. The pressure of the reaction gas within the reaction chambers 82 and 84 is on the order of 1 Torr, and the intensity of the magnetic field is 850 gauss.

When the conventional technique I is applied for a large area deposition, it needs a delicate operation to control the substrate temperature properly. Moreover, it is likely that the filament is elongated during the diamond deposition. This causes a change in the distance between the filament and the substrate during the reaction and hence it is not possible to obtain a diamond film of a desired quality.

The conventional technique II using 2.45 GHz microwaves of about 12 cm in wavelength is subject to restriction on the size of the quartz tube to avoid the leakage of the microwaves. To avoid the microwave leakage, the diameter of the tube must be less than 6 cm. Therefore, the size of the substrate is limited to less than about 1 cm×1 cm to ensure that the substrate is immersed in the plasma and the wall of the tube is not heated by the plasma to an excessively high temperature.

The conventional technique III usually uses the gas pressure of less than a few Torr and is able to produce a large volume plasma by applying microwaves to the reaction gas. However, it is not possible to synthesize diamond at a reasonably high growth rate under such a low gas pressure: the gas pressure must be increased at least to a range of 30 Torr or greater and accordingly the power of the microwaves must also be increased to about 1 kW or above. Under such conditions, the quartz window 83 and the cavity 82 are heated to an excessively high temperature and are etched by the reaction gas. In the worst case, the quartz window 83 and the walls of the cavity 82 are damaged.

To solve the foregoing problems in the conventional techniques, the inventors of the present invention have previously proposed a plasma reactor for diamond synthesis as shown in FIG. 8 in Japanese Patent Application No. 62-245068.

Shown in FIG. 8 is a microwave generator 91, a waveguide 92, an antenna 93, a microwave window 94 formed of quartz in a dome shape and disposed directly above the antenna 93, a vacuum chamber 95 for a generation of a reaction gas plasma, a substrate holder provided within the vacuum chamber 95, a substrate 97 mounted on the substrate holder 96, a plasma 98 surrounding the substrate 97, a reaction gas inlet port 99 attached on the wall of the vacuum chamber 95, and a reaction gas outlet port 100 attached on the wall of the vacuum chamber 95. Note that the antenna 93 is mounted on a quartz plate 101.

This plasma reactor for diamond synthesis has no external heating device. Microwaves generated by the microwave generator 91 are guided by the waveguide 92 toward the antenna 93, the antenna 93 changes the direction of propagation so that the microwaves propagate through the microwave window 94 into the vacuum chamber 95. This plasma reactor for diamond synthesis is capable of forming a diamond thin film on the substrate 97, such as a silicon wafer, of 3 in. in diameter.

The plasma is uniformly produced around the microwave window 94 because the microwave window 94 has a dome shape and hence the local heating of the microwave window 94 to an excessively high temperature rarely occurs. However, since the microwave window 94 is exposed directly to the plasma 98, the microwave window 94 is slowly etched by the plasma when the gas pressure is 30 Torr or higher and the microwave power is 2 kW or higher. Consequently, Si and $SiO_2$, produced by etching the microwave window 94 formed of quartz are incorporated into the diamond film and, moreover it is possible that the microwave window 94 is broken by excessive heating. Accordingly, the gas pressure is limited to 30 Torr below and the power of the microwaves is limited to 2 kW or below. Therefore, the growth rate of the diamond film is only about 0.3 μm/hr at the maximum. The gas pressure and the power of the microwaves must be increased to obtain a better growth rate.

SUMMARY OF THE INVENTION

Accordingly, it is an object of the present invention to provide a plasma reactor for diamond synthesis capable of stably forming a diamond film of a satisfactory quality at a sufficiently high growth rate on a substrate having a large area.

In a first aspect of the present invention, a plasma reactor for diamond synthesis, capable of depositing diamond on a substrate in contact with a plasma produced by applying microwaves to the reaction gas, comprises: a microwave generator; a waveguide having a rectangular cross section and connected to the microwave generator to guide the microwave; and an antenna disposed on a quartz plate within the waveguide; a microwave window provided above the waveguide extended perpendicularly to the axis of the antenna; a vacuum vessel defining a reaction chamber, comprising a bottomed water-cooled cylindrical member hermetically joined to the microwave window and the waveguide and provided in the circumferential wall thereof with a reaction gas inlet port and a outlet port; and a substrate holder disposed within the reaction chamber opposite to the microwave window, which can move toward and away from the microwave window to adjust the distance between the microwave window and the substrate holder.

In a second aspect of the present invention, the substrate holder is formed of an electrically conductive material, and a bias power supply is connected to the substrate holder to apply a bias voltage to the substrate holder.

In a third aspect of the present invention, the distance between the microwave window and the upper end of the water-cooled cylindrical member is 5 cm or less, and the inside diameter of the cylindrical member is 6 cm or greater.

In a fourth aspect of the present invention, the microwave window is held by a microwave window holding member, and the water-cooled cylindrical member is attached fixedly to the microwave window holding member.

In a fifth aspect of the present invention, the waveguide is branched into two branch sections arranged symmetrically with respect to the reaction chamber, and at least one of the branch sections is provided with an EH tuner.

In operation, microwaves generated by the microwave generator are propagated through the waveguide, and the direction of propagation of the microwave is changed by the antenna so that the microwave is propagated into the reaction chamber. The substrate holder, the side wall of the reaction chamber and the bottom wall of the reaction chamber define a microwave cavity. Since the substrate holder is able to move vertically, a desirable specific resonance mode $TE_{111}$ can be established by adjusting the position of the substrate holder so that the energy of the microwave is used efficiently for producing a plasma. The plasma is produced only in the central portion of the reaction chamber and the plasma will not be in contact with either the microwave window formed of quartz or the side wall of the reaction chamber, if the pressure of the reaction gas and the microwave power are adjusted properly. When a reaction gas which contains at least hydrogen and carbon atoms is introduced into the reaction chamber, the hydrocarbon gas is decomposed by the microwave to deposit graphite, amorphous carbon and diamond on the substrate. Atomic hydrogen in the plasma remove the graphite and the amorphous carbon from the substrate, so that only a diamond film is formed on the substrate.

A bias voltage applied to the substrate holder increases the growth rate of the diamond film.

The circular hole in the cylindrical member having an inside diameter of 6 cm or greater enables efficient introduction of the microwaves into the reaction chamber. Furthermore, the disposition of the cylindrical member above the microwave window prevents the excessive heating and etching of the microwave window by the plasma.

The symmetrical arrangement of two branch sections branching from the waveguide with respect to the reaction chamber causes the symmetrical propagation of the microwave through the reaction chamber. Therefore, even if the position of the substrate holder is changed during the diamond film synthesis, the plasma is always located in the central portion of the reaction chamber and hence the plasma does not come into contact with the side wall of the reaction chamber. The EH tuner provided in one of the two branch sections of the waveguide controls the reflected microwaves properly to prevent the heating of the tuner and the waveguide to an excessively high temperature and minimizes the loss of the microwave energy.

BRIEF DESCRIPTION OF THE DRAWINGS

The above and other objects, features and advantages of the present invention will become more apparent from the following description taken in conjunction with the accompanying drawings, in which.

DESCRIPTION OF THE PREFERRED EMBODIMENTS

Figure 1:
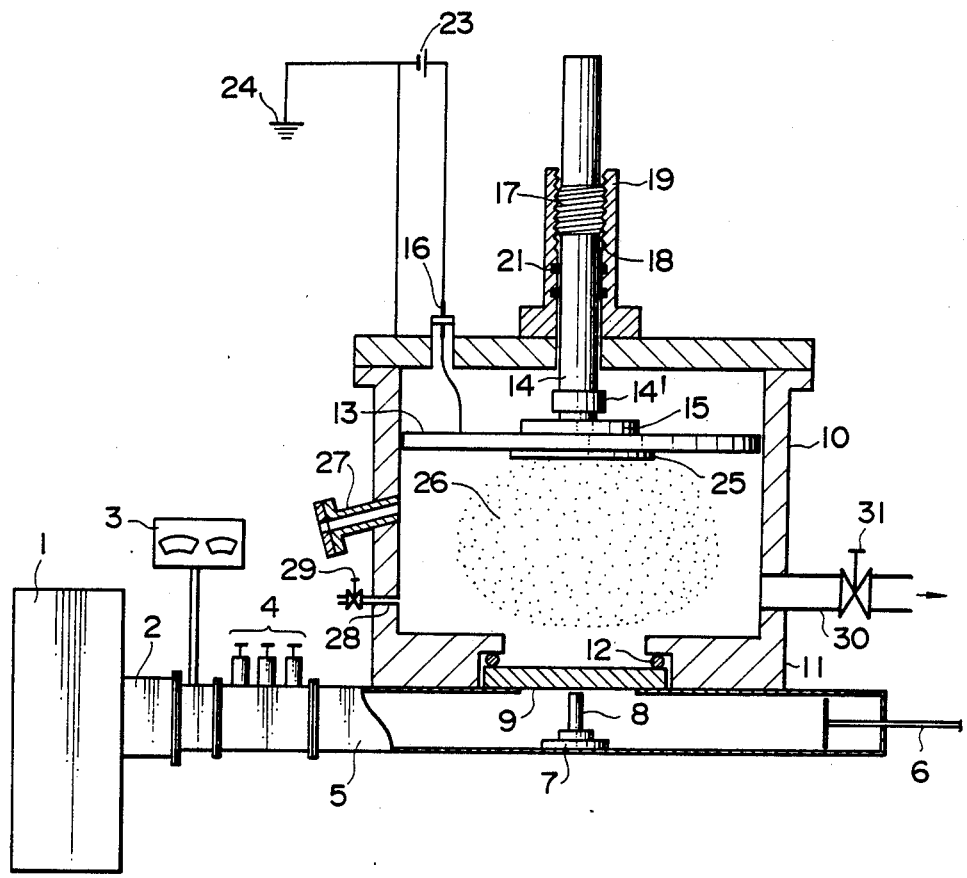
FIG. 1 is a schematic side elevation partly in section of a plasma reactor for diamond synthesis in a first embodiment according to the present invention.

First Embodiment (FIG. 1)

Referring to FIG. 1, a microwave generator 1 is connected to a waveguide 5 through an isolator 2, a power monitor 3 and tuners 4 arranged in that order. A plunger 6 is provided in the free end, namely, one end from the microwave generator 1, of the waveguide 5. An antenna 8 is mounted on a quartz plate 7 within the waveguide 5. A circular microwave window 9 is disposed directly above the antenna 8 on the upper wall of the waveguide 5 so as to cover an opening formed in the upper wall of the waveguide 5. A cylindrical member 11 forming a bottom part of a reaction vacuum vessel 10 and provided with an opening in the wall thereof is joined hermetically to the wall of the waveguide 5. An O ring 12 is provided between the bank of the opening of the bottom wall of the cylindrical member 11 and the periphery of the microwave window 5 to seal the reaction chamber 10. A circular substrate holder 13 provided in the upper section of the reaction chamber 10 is fixed to a table holder 15 fixedly connected through an insulating member 14' to a screw rod 14 having a threaded portion 17 engaging an internal thread 18 formed in a screw rod holding member 19. A gap between the screw rod 14 and the screw rod holding member 19 is sealed by sealing members 21. The screw rod 14 is turned together with the substrate holder 13 to form a diamond film over the surface of a substrate 25 held on the substrate holder 13 in a uniform thickness. Since the substrate 25 is heated to a temperature in the range of 800° to 1000° C., it is desirable to form the substrate holder 13 of a carbonaceous material such as graphite or a refractory metal such as tungsten.

A dc bias power supply 23 is connected to a terminal 16 provided on the upper wall of the reaction chamber 10, and the terminal 16 is connected to the substrate holder 13 by a flexible wire to apply a bias voltage to the substrate holder 13. The dc bias power supply 23 is also connected to a ground 24.

The substrate 25, is for instance, a silicon wafer of 4 in. or less in diameter. The substrate 25 is attached detachably to the lower surface of the substrate holder 13. The surface of the substrate 25 is polished by a diamond paste before attached to the substrate holder 13 so that a continuous diamond film can be formed on the substrate surface 13. In FIG. 1, indicated at 26 is a plasma, at 27 is a viewing port provided on the side wall of the reaction chamber 10 to observe the substrate temperature, at 28 is a reaction gas inlet port connected through a valve 29 to a reaction gas supply unit, not shown, and at 30 is a gas outlet port connected through a valve 31 to a vacuum pump, not shown.

Figure 2:
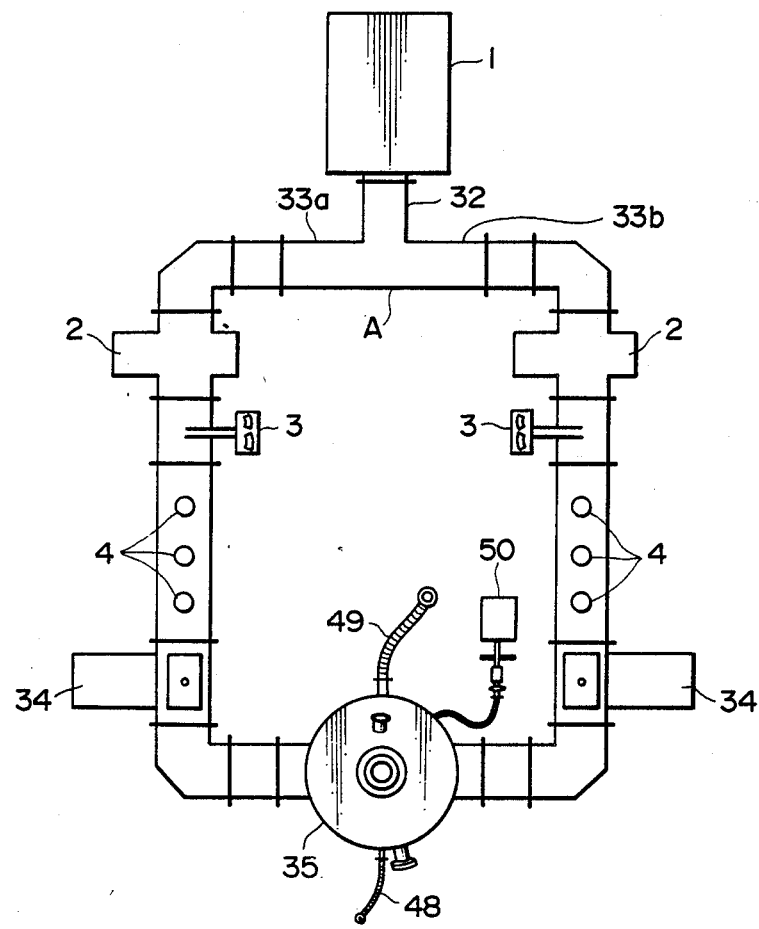
FIG. 2 is a schematic plan view of a plasma reactor for diamond synthesis in a second embodiment according to the present invention.
Figure 3:
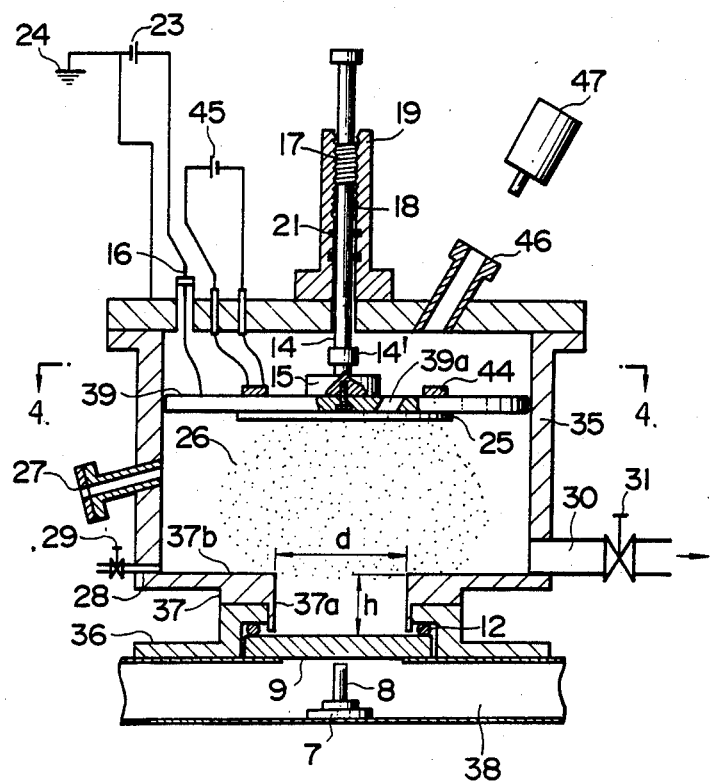
FIG. 3 is a schematic sectional view of the plasma reactor for diamond synthesis of FIG. 2.
Figure 4:
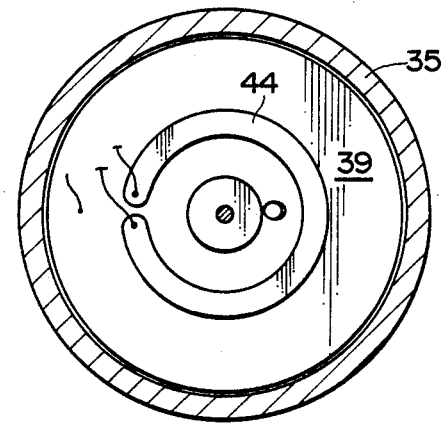
FIG. 4 is a sectional view taken on line B—B in FIG. 3.
Figure 5:
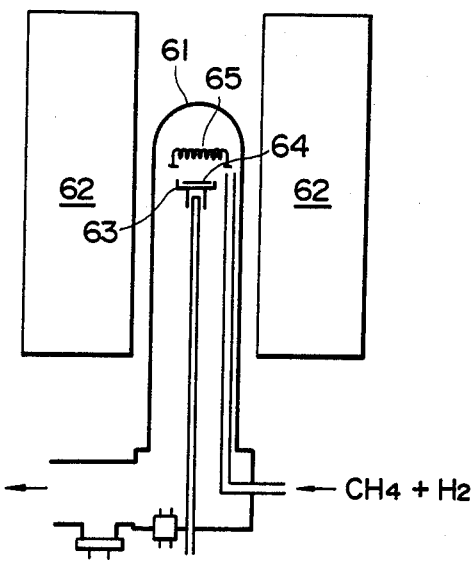
FIG. 5 is a schematic side elevation of a conventional reactor for diamond synthesis using a hot filament.
Figure 6:
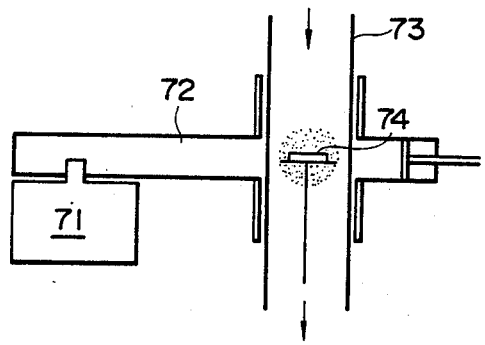
FIG. 6 is a schematic side elevation of a conventional plasma reactor for diamond synthesis using microwave.
Figure 7:
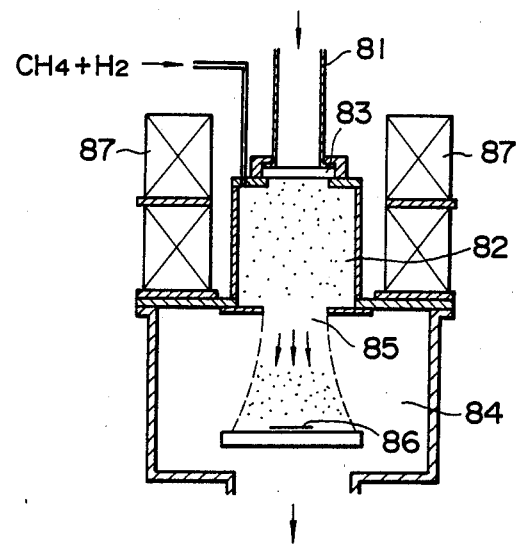
FIG. 7 is a schematic side elevation of a plasma reactor using the electron cyclotron resonance.
Figure 8:
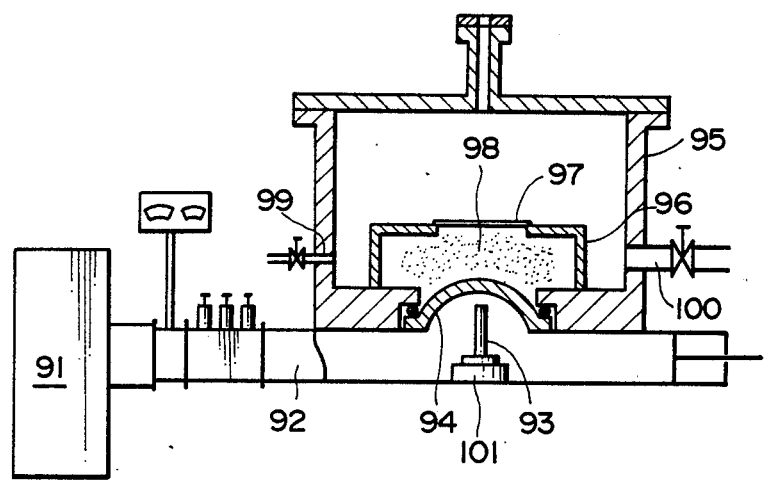
FIG. 8 is a schematic side elevation partly in section of a plasma reactor for diamond synthesis previously proposed by the applicants of the present patent application.

Second Embodiment (FIGS. 2, 3 and 4)

A plasma reactor for diamond synthesis in a second embodiment according to the present invention is illustrated in FIGS. 2 to 4, in which the parts same as those described previously with reference to FIG. 1 are denoted by the same reference numerals.

Referring to FIG. 2, a microwave generator 1 is connected to a waveguide 32. The waveguide 32 is branched at a diverging point A into branch sections 33a and 33b. The branch sections 33a and 33b are provided each with an isolator 2, a power monitor 3, stub tuners 4 and an EH tuner 34. The respective extremities of the branch sections 33a and 33b join together below a reaction chamber 35 as shown in FIG. 3. The branch sections 33a and 33b are arranged symmetrically with respect to the reaction vacuum vessel 35.

Referring to FIG. 3, the reaction vessel 35 consists of a window holding member 36, a cylindrical bottom member 37 and an upper wall. An antenna 8 is mounted on a quartz plate 7 disposed in the waveguide 38. A circular microwave window 9 formed of quartz is disposed directly above the antenna 8 and is held on the upper wall of the waveguide 38 by the window holding member 36. An O ring 12 is provided between the window holding member 36 and the microwave window 9. The cylindrical bottom member 37 is mounted fixedly on the window holding member 36 and is provided with a circular hole 37a coaxially with the microwave window 9 in the wall thereof. The diameter d of the circular hole 37a must be 6 cm or greater to introduce a microwave efficiently into the reaction vacuum vessel 35. In this embodiment, the diameter d is 8 cm. The distance h between the inner surface 37b of the bottom wall of the cylindrical member 37 and the upper surface of the microwave window 9 must be 5 cm or less. In this embodiment, the distance h is 5 cm. If the distance h is excessively large, a plasma is produced within the circular hole 37a of the bottom wall of the cylindrical member 37 and the microwave window 9 is etched by the plasma.

A substrate holder 39 is fixed to the lower surface of a holding member 15 fixedly connected through an insulating member 14' to a screw rod 14 having a threaded portion 17. An oblique through hole 39a is formed in the substrate holder 39. The threaded portion 17 of the screw rod 14 engages an internal thread 18 formed in a screw rod holding member 19. A gap between the screw rod 14 and the screw rod holding member 19 is sealed by sealing members 21. The substrate holder 39 is formed of a graphite.

A dc bias power supply 23 is connected to a terminal 16, which in turn is connected to the substrate holder 39 by a flexible wire to apply a bias voltage to the substrate holder 39. The dc bias power supply 23 is also connected to a ground 24.

A substrate 25 is a silicon wafer of 4 in. or less in diameter. The substrate 25 is attached detachably to the lower surface of the substrate holder 39 directly above and coaxially with the antenna 8. The surface of the substrate 25 is polished beforehand by a diamond paste so that a continuous diamond film can be formed thereon.

As shown in FIGS. 3 and 4, a circular heater 44 is provided on the substrate holder 39. The heater 44 is connected to a power supply 45.

In FIG. 3, indicated at 26 is a plasma and at 27 is a viewing port attached on the side wall of the reaction chamber 35 to observe the condition of the plasma 26. A viewing port 46 is formed in the upper wall of the reaction chamber 35 to observe the temperature of the substrate 25 through a hole 39a formed in the substrate holder 39. Indicated at 47 is an optical thermometer. A reaction gas inlet port 28 is connected through a valve 29 and a reaction gas supply pipe 48 (FIG. 2) to a reaction gas supply unit, not shown. A gas outlet port 30 is connected through a valve 31 and an exhaust pipe 49 (FIG. 2) to a vacuum pump, not shown.

Experiment 1

The plasma reactor for diamond synthesis in the first embodiment (FIG. 1) was used. A hydrocarbon used in Experiment 1 is methane, which is the most inexpensive hydrocarbon. Other hydrocarbons such as ethane, propane, ethylene, alcohol and acetone may be used. The reaction gas contained 1% methane and 99% hydrogen. The flow rate of the reaction gas was 200 cm$^3$/min.

First, the valve 31 was opened to evacuate the reaction chamber 10, and then the valve 29 was opened to supply the material gas into the reaction chamber 10. The pressure within the reaction chamber 10 was maintained at 200 Torr during the experiment. The microwave generator 1 was operated at an output power of 2.5 kW to generate microwaves of 2.45 GHz. No bias voltage was applied to the substrate holder 13.

The direction of propagation of the microwave guided by the waveguide 5 was changed by the antenna 8 so that the microwaves are propagated in a direction perpendicular to the waveguide 5. The substrate 25, i.e., a silicon wafer, was heated by the microwaves to about 800° C. The screw rod 14 was turned to adjust the distance between the substrate 25 and the microwave window 9 so that a resonance mode $TE_{111}$ is established. A plasma 26 of the reaction gas was produced only in the central portion of the interior of the reaction chamber 10.

A diamond film of 3 in. in diameter and 4 μm in thickness was formed on the surface of the 4 in. silicon substrate 25 in four hours of the diamond film deposition. Results of X-ray diffraction and Raman scattering measurements of the diamond film proved that the diamond film had a good quality. The growth rate of the diamond film was 1 μm/hr, which is more than three times the growth rate by conventional reactors for diamond synthesis (about 0.3 μm/hr).

Since the substrate holder 13 can be moved vertically, the position of the substrate holder 13 can be adjusted, according to the pressure of the reaction gas within the reaction chamber 10 and the microwave power, to establish the desired microwave resonance mode and to adjust the position of the plasma 26. On the other hand, the reaction chamber of the conventional plasma reactor using a microwave resonance cavity is not provided with any movable parts for adjusting the resonance mode, because it has been considered that the movable parts would form a discontinuity in the microwave resonance cavity and reduce the efficiency of the microwave resonance cavity. However, when the reaction chamber is filled with a plasma at a comparatively high pressure of 200 Torr, most of the microwave energy is used efficiently for producing the plasma, and hence the adverse influence of the discontinuity on the efficiency of the microwave is negligible.

Experiment 2

The plasma reactor for diamond synthesis in the first embodiment (FIG. 1) was used. A bias voltage of 500 V was applied to the substrate holder 13 as a positive electrode with respect to the reaction chamber 10. Other operating conditions are the same as those of Experiment 1. A diamond film of 3 in. in diameter and 4.4 μm in thickness was formed on the surface of the 4 in. silicon substrate 25 in four hours. The results of X-ray diffraction and Raman scattering measurements of the diamond film proved that the diamond film had a good quality.

Experiment 3

The plasma reactor for diamond synthesis in the second embodiment (FIGS. 2 to 4) was used. A reaction gas containing 1% methane and 99% hydrogen was used. The reaction gas was supplied at a flow rate of 300 cm$^3$/min and the pressure within the reaction chamber 35 was maintained at 300 Torr during the experiment. The microwave generator 1 was operated at 4 kW in output power to generate microwaves of 2.45 GHz. No bias voltage was applied to the substrate holder 39.

The stub tuners 4 and the EH tuners 34 were adjusted to minimize the reflected microwave reflected by the reaction chamber 35 in order that the stub tuners 4, the EH tuners 34, and the waveguide 38 were not heated to an excessively high temperature. Both of the branch sections 33a and 33b need not be provided with the EH tuners 4; the excessive heating can be minimized even when only either the branch section 33a or the branch section 33b is provided with an EH tuner.

The screw rod 14 was turned to adjust the vertical position of the substrate holder 39 to adjust the distance between the substrate 25 and the microwave window 9 so that the resonance mode $TE_{111}$ is established in the reaction chamber 35. Although the pressure of the material gas within the reaction chamber 35 was as high as 300 Torr, the plasma of the reaction gas was produced only in the central portion of the interior of the reaction chamber 35 and the side wall of the reaction chamber 35 was not exposed to the plasma. Consequently, a pure diamond film of 3 in. in diameter and 8 μm in thickness was formed on the substrate surface 25 in four hours. The results of X-ray diffraction and Raman scattering measurements of the diamond film proved that the diamond film had a good quality. The growth rate of the diamond film was 2 μm/hr, which is far higher than that by conventional plasma reactors for diamond synthesis (0.3 μm/hr). During the experiment, the temperature of the substrate 25 was measured by the optical thermometer 47 through the viewing hole 46 and the through hole 39a formed in the substrate holder 39 and the voltage of the power supply 45 for the heater 44 was regulated to maintain the temperature of the substrate 25 at about 800° C. during the experiment.

Experiment 4

The plasma reactor for diamond synthesis in the second embodiment (FIGS. 2 to 4) was used. A bias voltage of 500 V was applied by the bias power supply 23 across the substrate holding table 39, as a positive electrode, and the reaction chamber 35. Other operating conditions are the same as those for the Experiment 3. A diamond film of 3 in. in diameter and 8.8 μm in thickness was formed on the surface of the substrate 25 in four hours. The results of X-ray diffraction and Raman scattering measurements of the diamond film proved that the diamond film had a good quality.

As is apparent from the foregoing description, the present invention has the following advantages.

(1) The vertically movable substrate holder enables the positional adjustment of the substrate according to the variation of the pressure of the reaction gas and the power of the microwave to establish the specific microwave resonance mode $TE_{111}$ so that a plasma will be produced only in the central portion of the interior of the reaction chamber.

(2) The application of a bias voltage to the substrate holder enhances the growth rate of a diamond film. The application of a bias voltage of 500 V across the substrate holder and the reaction chamber increases the growth rate by about 10% as compared with that in diamond film forming operation in which no bias voltage is applied across the substrate holder and the reaction chamber.

(3) The circular hole of 6 cm or greater in diameter formed in the bottom wall of the cylindrical member enables efficient introduction of the microwaves generated by the microwave oscillator into the reaction vacuum vessel, and the plasma is not formed within the circular hole and hence the microwave window is not etched by the plasma because the distance between the upper surface of the bottom wall of the reaction chamber and the upper surface of the microwave window is 5 cm or less.

(4) The disposition of the cylindrical member above the quartz microwave window prevents the heating of the microwave window to an excessively high temperature by the plasma.

(5) The symmetrical arrangement of the branch sections of the waveguide with respect to the reaction chamber introduces the microwaves into the reaction chamber in a symmetrical way, so that a plasma is formed only in the central portion of the reaction chamber even if the pressure of the reaction gas is comparatively high (300 Torr). The suppression of the reflected microwaves by the EH tuners prevents the heating of the stub tuners and the branch section of the waveguide to an excessively high temperature even when the microwave power is as high as 4 kW.

(6) A diamond film of 3 in. in diameter can be formed on a 4 in. silicon wafer at a high growth rate of 2 μm/hr as compared with a growth rate of 0.3 μm by conventional reactors for diamond synthesis under a comparatively high pressure (300 Torr) of the reaction gas and at a comparatively high power (4 kW) of the microwaves.

(7) Since the plasma is produced only in the central portion of the interior of the reaction chamber, the microwave window can have a comparatively inexpensive disk form rather than a dome form because the microwave window is not exposed directly to the plasma and is not etched by the plasma.

Although the invention has been described in its preferred forms with a certain degree of particularity, obviously many changes and variations are possible therein. It is therefore to be understood that the present invention may be practiced otherwise than specifically described herein without departing from the scope and spirit thereof.

What is claimed is:

1. A plasma reactor for diamond synthesis using a reaction gas comprising at least hydrogen and carbon atoms, capable of depositing diamond on a substrate placed in contact with a plasma produced by applying microwaves to the reaction gas to decompose the reaction gas, comprising:
    a microwave generator;
    a waveguide having a rectangular cross section and connected to the microwave generator to guide the microwaves;
    an antenna disposed on a quartz plate within the waveguide;
    a microwave window facing the antenna and provided on the wall of the waveguide so as to extend perpendicularly to the axis of the antenna;
    a reaction chamber defined by a cylindrical bottom member hermetically joined to the microwave window and the waveguide and provided with a circular hole to form a circular hole in the bottom wall of said reaction chamber, (b) an upper wall closing an upper end of the reaction chamber, and (c) a circumferential wall with a reaction gas inlet port and a gas outlet port; and
    a substrate holder disposed within the reaction chamber in facing opposition to the microwave window, said substrate holder being movably mounted so as to be moved toward and away from the microwave window, so as to adjust the distance between the microwave window and the substrate holder.

2. A plasma reactor for diamond synthesis according to claim 1, wherein said substrate holder is formed by an electrically conductive material, including a bias power supply electrically connected to said substrate holder for applying a bias voltage to the substrate holder.

3. A plasma reactor for diamond synthesis according to claim 1 or 2, wherein the distance between the upper surface of the bottom wall of the cylindrical member and the upper surface of the microwave window is no more than 5 cm, and the diameter of the cylindrical member is at least 6 cm.

4. A plasma reactor for diamond synthesis according to claim 1 or 2, wherein said cylindrical member is fixed to a microwave window holding member holding the microwave window.

5. A plasma reactor for diamond synthesis according to any one of claims 1 or 2, wherein said waveguide has two branch sections arranged symmetrically with respect to said reaction chamber, and at least one of the branch sections is provided with an EH tuner.

6. A plasma reactor for diamond synthesis according to claim 3, wherein said waveguide has two branch sections arranged symmetrically with respect to said reaction chamber, and at least one of the branch sections is provided with an EH tuner.

7. A plasma reactor for diamond synthesis according to claim 4, wherein said waveguide has two branch sections arranged symmetrically with respect to said reaction chamber, and at least one of the branch sections is provided with an EH tuner.

8. A plasma reactor according to claim 1 wherein said microwave window is planar.

9. A plasma reactor according to claim 1 wherein said substrate holder is positioned within the reaction chamber such that a resonance mode $TE_{111}$ is established in said reaction chamber.

* * * * *